US007364445B1

(12) United States Patent
Ni et al.

(10) Patent No.: US 7,364,445 B1
(45) Date of Patent: Apr. 29, 2008

(54) USB FLASH DEVICE WITH RUBBER COVER

(75) Inventors: Jim C. Ni, San Jose, CA (US); David Nguyen, San Jose, CA (US); Nan Nan, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 11/735,349

(22) Filed: Apr. 13, 2007

(51) Int. Cl.
*H01R 13/44* (2006.01)

(52) U.S. Cl. .................................. 439/140

(58) Field of Classification Search ............ 439/140, 439/134–137, 518, 638, 133, 680, 135, 131, 439/304, 148, 353, 357, 76.1, 141, 350, 352, 439/367; 361/752, 733, 728, 736–737, 115
See application file for complete search history.

(56) References Cited

U.S. PATENT DOCUMENTS

| | | | |
|---|---|---|---|
| 5,400,216 A | 3/1995 | Tsai | |
| 5,941,725 A | 8/1999 | Brennan et al. | |
| 5,941,733 A | 8/1999 | Lai | |
| 6,036,544 A | 3/2000 | Brunker et al. | |
| 6,135,786 A | 10/2000 | Johnson et al. | |
| 6,241,534 B1 | 6/2001 | Neer et al. | |
| 6,309,255 B1 | 10/2001 | Yu | |
| 6,332,783 B1 | 12/2001 | Ukiya et al. | |
| 6,618,243 B1 | 9/2003 | Tirosh | |
| 6,671,808 B1 | 12/2003 | Abbott et al. | |
| 6,676,419 B1 | 1/2004 | Lin et al. | |
| 6,733,329 B2 * | 5/2004 | Yang .................. 439/518 |
| 6,744,634 B2 | 6/2004 | Yen | |
| 6,778,401 B1 | 8/2004 | Yu et al. | |
| 6,854,984 B1 | 2/2005 | Lee et al. | |
| 6,877,994 B2 | 4/2005 | Huang | |
| 6,944,028 B1 | 9/2005 | Yu et al. | |
| 6,948,983 B1 | 9/2005 | Peng | |
| 6,999,322 B1 | 2/2006 | Lin | |
| 7,004,794 B2 | 2/2006 | Wang et al. | |
| 7,035,110 B1 | 4/2006 | Wang et al. | |
| 7,044,802 B2 | 5/2006 | Chiou et al. | |
| 7,052,287 B1 | 5/2006 | Ni et al. | |
| 7,074,052 B1 | 7/2006 | Ni et al. | |
| 7,090,541 B1 | 8/2006 | Ho | |
| 7,241,153 B2 * | 7/2007 | He et al. ............ 439/148 |
| 7,275,941 B1 * | 10/2007 | Bushby ............. 439/133 |
| 2003/0100203 A1 | 5/2003 | Yen | |
| 2004/0198079 A1 | 10/2004 | Aronson et al. | |
| 2005/0085128 A1 | 4/2005 | Chai et al. | |
| 2005/0085129 A1 | 4/2005 | Chiou et al. | |
| 2005/0197011 A1 | 9/2005 | Tsai | |
| 2005/0245132 A1 | 11/2005 | Huang et al. | |
| 2005/0255752 A1 | 11/2005 | Huang | |

* cited by examiner

*Primary Examiner*—Edwin A. Leon
(74) *Attorney, Agent, or Firm*—Bever, Hoffman & Harms, LLP; Patrick T. Bever

(57) ABSTRACT

A USB device includes a printed circuit board assembly (PCBA), a metal shell secured to a front of the PCBA, a plastic frame secured to a rear of the PCBA, and a rubber case including a case body covering the plastic frame case such that a plug shell connector extends from the second front end opening. A rubber cap is removably mounted over the plug shell connector to entirely enclose the USB device when not in use. The rubber case is molded to include a cosmetic feature, such as a soccer ball, a sports team logo, or a company logo.

20 Claims, 14 Drawing Sheets

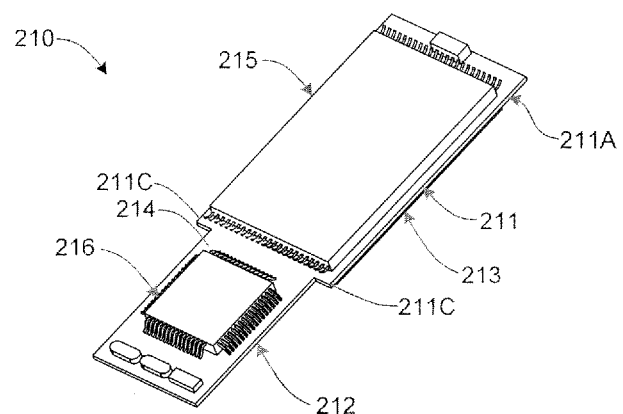
FIG. 9
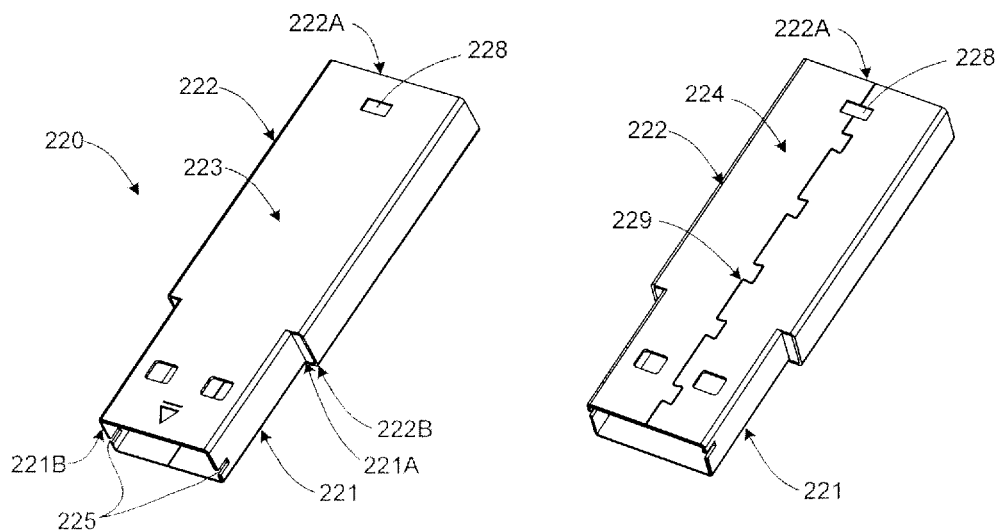
FIG. 10(A)  FIG. 10(B)

USB FLASH DEVICE WITH RUBBER COVER

FIELD OF THE INVENTION

This invention relates to USB flash devices (also known as "USB flash drives"), and more particularly to USB devices including low cost protective covers that both reliably protect the USB flash drive and provide cosmetic features that are appealing to users.

BACKGROUND OF THE INVENTION

Rapid advances in technology in several areas have converged to enable small, portable memory cards with vast capacities. Flash memory technologies such as those using electrically-erasable programmable read-only memory (EEPROM) have produced chips storing 128 M-Bytes or more. Small flash-memory cards have been designed that have a connector that can plug into a specialized reader, such as for compact-flash, secure-digital, memory stick, or other standardized formats.

More recently, flash memory cards are being sold that contain a USB connector. Such USB-flash memory cards do not require a specialized reader but can be plugged into a USB connector on a host system, such as a personal computer (PC). These USB-flash memory cards can be used in place of floppy disks, hence the name "USB flash drives". A USB-flash drive can have a capacity of more than ten floppy disks in an area not much larger than a large postage stamp.

In a commercial world of USB flash drives a small difference in appearance or price can make a big different in a consumers decision to purchase one USB flash drive product over another. From a practical point of view, a USB drive's appearance draws first attention from a potential consumer. Qualities generally valued in the decision of a USB device are aesthetic (shape and color), as well as a perception that the USB device can be easily operated (i.e., that a cap can be easily removed and reliably replaced), and that the overall structure can withstand being dropped or handled roughly without fatally damaging the USB device (i.e., causing the loss of data). A secondary consideration in the decision to purchase is the price of the USB device.

What is needed is a protective cover for a USB device that is both low cost and conveys confidence to a potential consumer that the USB device is sufficiently protected against damage due, for example, to dropping or other rough handling by the user. What is also needed is for the cover to be easily molded and colored to provide an attractive cosmetic appearance.

SUMMARY OF THE INVENTION

The present invention is directed to a USB flash device having a protective cover that includes a rigid (metal and/or plastic) inner frame for maintaining a PCBA inside a cut-out (hollow) region, and an outer rubber case mounted over and secured to the rigid frame. The rigid inner frame facilitates inexpensive assembly of the USB flash device, provides a lightweight and reliable mechanism for protecting the integrated circuits and other components mounted on the PCBA from damage, and also provides a rigid support for the rubber case. The rubber case provides volume (bulk) to the USB device, which conveys confidence to a potential consumer that the USB flash device is sufficiently protected against damage due, for example, to dropping or other rough handling by the user. In accordance with an aspect of the present invention, the rubber case is also easily in inexpensively molded and colored to provide a desirable cosmetic appearance (e.g., to include a soccer ball pattern) that is attractive to potential consumers. Thus, by providing both a rigid inner frame and an outer rubber case, the present invention provides an inexpensive and convenient method for producing USB flash devices that display attractive cosmetic features. For example, in one embodiment a soccer ball pattern is provided at one or both ends of the rubber case. Soccer is a very popular sport worldwide, and by forming the rubber case to include a soccer ball, the resulting USB flash device is attractive to a large segment of the population, thereby increasing the pool of attracted potential customers. Because the rubber case is mounted on the rigid inner frame and not attached directly to the PCBA, the rubber case can be produced using inexpensive molding techniques, thereby facilitating the inexpensive production of a wide range of other cosmetic features, such as basketball patterns, baseball patterns, sports team logos, or even company logos (e.g., to facilitate promotional programs in which the USB devices are given away by the company whose logo is displayed on the rubber case). Note that the rigid inner case can be identical for multiple rubber cases, each having a different cosmetic feature, thereby minimizing production costs by facilitating the large volume production of the inner frame.

In accordance with a generalized embodiment of the present invention, a USB flash device includes a printed circuit board assembly (PCBA), a metal shell secured to a front end of the PCBA, a plastic frame mounted over a rear end of the PCBA, and a rubber case body disposed over the plastic frame and the PCBA such that only a plug shell connector portion of the metal shell extends from a front end of the case body/plastic frame assembly for insertion into a female USB socket on a host system. The case body includes a locking protrusion disposed adjacent to its closed rear end, and the case body includes an engagement opening disposed to receive the locking protrusion such that the case body is secured to the plastic frame.

In accordance with an aspect of the invention, the rubber case also includes a rubber cap that is mounted over the plug shell connector such that the rubber cap and case body entirely enclose the PCBA. In a specific embodiment, the rubber cap includes protrusions that extends into corresponding recesses formed in the case body, thereby providing a seamless appearance. In one particular embodiment, the protrusion includes a portion of a cosmetic feature (e.g., a soccer ball), thereby causing the user to directly touch the cosmetic feature in order to remove the rubber cap to expose the USB plug connector. For example, when the cosmetic feature is a soccer ball, a soccer fan (user) is provided the enjoyable task of squeezing the soccer ball feature each time he/she uses the USB flash device.

In accordance with a specific embodiment of the present invention, at least one of the rubber cap and the case body comprises slip-resistant texturing that further enhances the appeal of the USB flash device to a potential consumer by conveying a rugged, durable appearance.

In accordance with a specific embodiment of the present invention, the plastic frame includes a collar disposed over the plug shell connector and attached to the frame body adjacent to the first front end opening. The collar comprises a base defining a central opening for slidably receiving the plug shell connector during assembly, and defining at least one slot disposed on an inside surface of the central opening to receive a side edge of the PCB. The collar also includes locking fingers that are snap-coupled into corresponding locking grooves defined in said frame body. This plastic frame arrangement facilitates low cost production by providing an inexpensive and simple assembly process.

In accordance with another specific embodiment of the present invention, an elongated metal includes a handle shell portion, with the plug shell connector integrally formed at a front end thereof. The handle portion handle portion of said PCBA is received inside the handle shell portion, thereby providing further protection for the PCBA by surrounding the integrated circuits with a metal frame. In this embodiment, the plastic frame body is snap-coupled onto a rear end of the metal frame, and a plastic tray disposed between a portion of the plug shell connector and the plug portion of the PCBA. The plastic frame body and plastic tray serve to support the PCBA inside the metal frame, thereby avoiding possible short circuit conditions that can be caused by directed contact between the PCBA and the metal frame.

In accordance with yet another embodiment of the present invention, a method for producing USB flash devices comprises securing a metal shell onto a printed circuit board assembly (PCBA) such that metal contacts formed on a PCB of the PCBA are disposed in a plug shell connector portion of the metal shell, securing a plastic frame onto the metal shell and the PCBA such that at least a portion of the handle portion of the PCB is disposed inside a central cavity of the plastic frame and the plug shell connector is exposed on the first front end of the plastic frame, and mounting a rubber case onto the metal shell, PCBA and plastic frame such that the plastic frame is inserted inside a central cavity of a case body with the plug shell connector extending from a front end thereof. The method further includes mounting a rubber cap of the rubber case onto the plug shell connector.

BRIEF DESCRIPTION OF THE DRAWINGS

These and other features, aspects and advantages of the present invention will become better understood with regard to the following description, appended claims, and accompanying drawings, where:

FIG. 9 is a bottom perspective view showing a PCBA of the USB flash device of FIG. 8(A);

FIGS. 10(A) and 10(B) are top and bottom perspective views showing a metal shell of the USB device of FIG. 8(A);

DETAILED DESCRIPTION OF THE DRAWINGS

The present invention relates to an improvement in USB flash devices. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
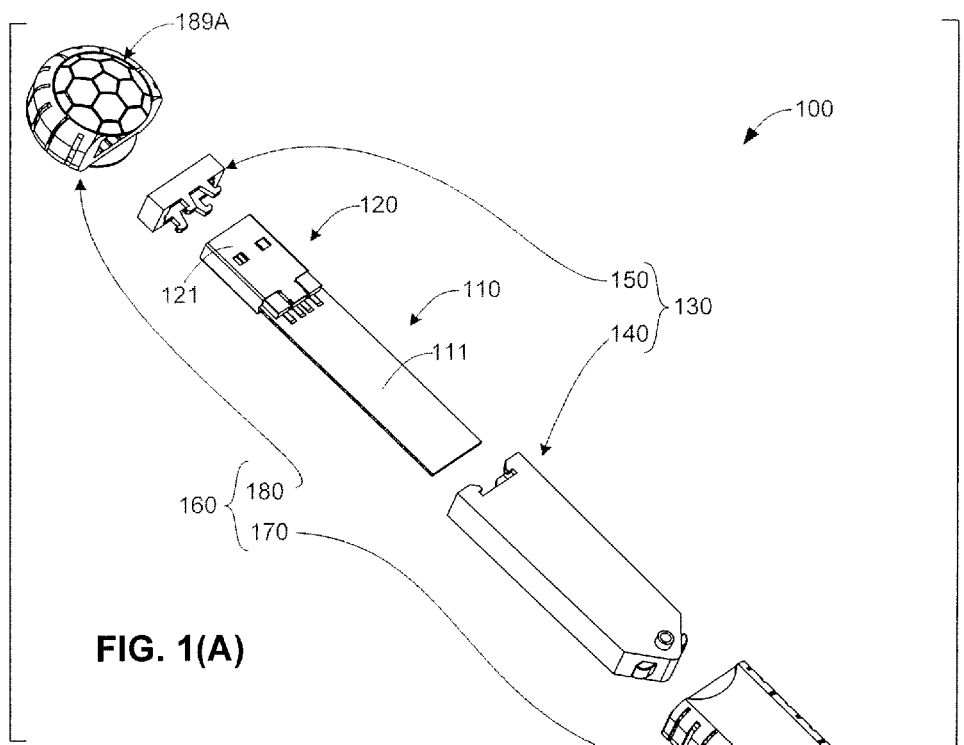
FIGS. 1(A) and 1(B) are exploded top side perspective and assembled top side perspective views showing a USB flash device according to an embodiment of the present invention.
Figure 1B:
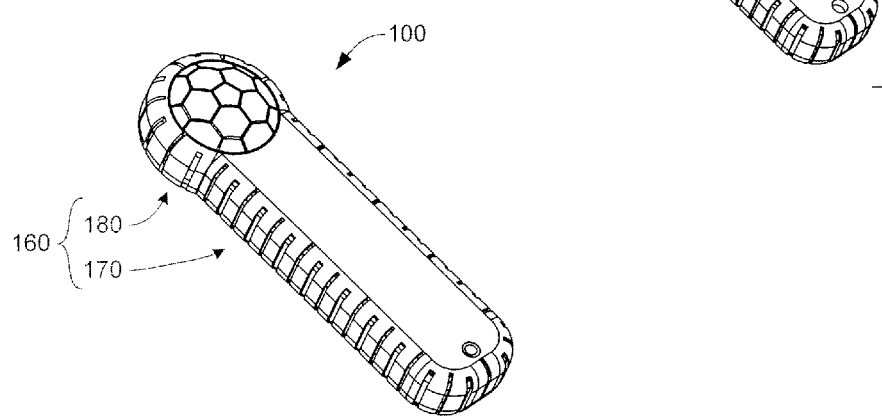

FIGS. 1(A) and 1(B) are exploded and assembled perspective views showing a Universal-Serial-Bus (USB) device 100 according to a first embodiment of the present invention. USB device 100 generally includes a printed circuit board assembly (PCBA) 110, a metal frame 120 attached to PCBA 110, a plastic frame 130 including a frame body 140 that is mounted over a printed circuit board (PCB) 111 of PCBA 110 and a collar 150 for securing frame body 140 to PCBA 110, and a protective rubber case 160 including a case body 170 that is mounted over frame body 140, and a rubber cap 180 for covering a plug shell portion 121 of metal frame 120. As indicated in FIG. 1(B), when fully assembled with rubber cap 180 mounted over plug shell portion 121, USB device 100 is entirely encased by case body 170 and rubber cap 180 of rubber case 160.

Figure 2A:
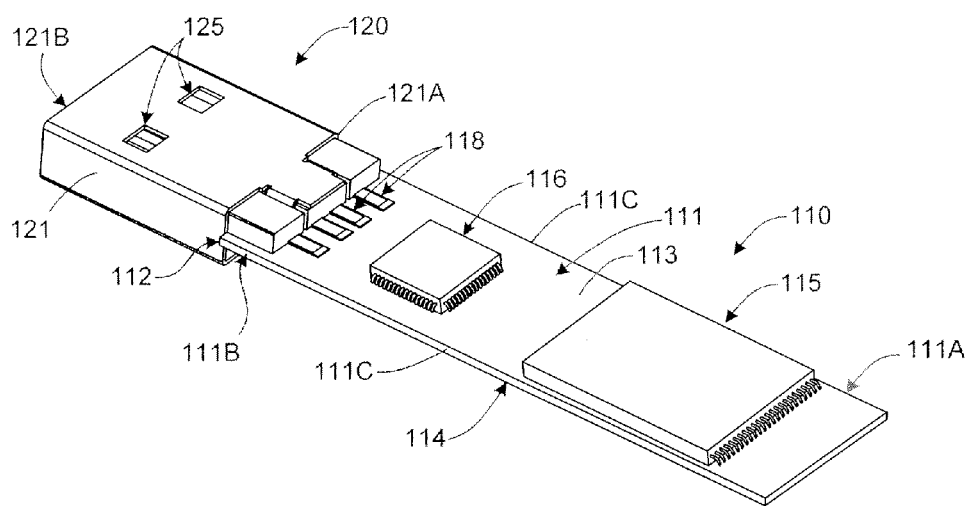
FIGS. 2(A) and 2(B) are top side perspective and cross-sectional front views showing a PCBA of the USB flash device of FIG. 1(A)

Referring to FIG. 2(A), PBCA 110 includes PCB 111, which is a substantially flat printed circuit substrate having a rear (handle) portion 111A and a front (plug) portion 111B, and has opposing sides that are arbitrarily referred to below as upper (first) surface 113 and lower (second) surface 114. At least one flash memory device integrated circuit (flash IC) 115 and zero or more memory control ICs 116 and zero or more auxiliary ICs (e.g., RF communication circuits, not shown) are mounted on upper surface 113 and/or lower surface 114. Formed on upper surface 113 of PCB 111 adjacent to plug portion 111B are metal contacts 118, which are shaped and arranged in a pattern established by the USB specification, and extend into and are exposed through a front end opening 121B of metal shell 120 according to USB specifications. ICs 115 and 116 are electrically connected to each other and to metal contacts 118 by way of metal traces (not shown) that are formed on PCB 111 according to known PCB manufacturing techniques such that metal contacts 118 and ICs 115 and 116 (as well as zero or more other circuit components, which are omitted for brevity) are electrically interconnected by a predefined network including the conductive traces and other conducting structures that are sandwiched between multiple layers of an insulating material (e.g., FR4) and adhesive.

Figure 2B:
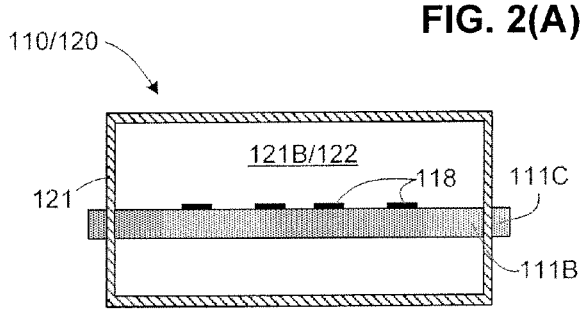

As also shown in FIG. 2(A), metal shell 120 is attached PCBA 110 according to USB standards. In particular, metal shell 120 includes a plug shell connector 121 that is attached at its rear end 121A to PCBA 110, and surrounds plug portion 111B of PCB 111 such that, as shown in FIG. 2(B), metal contacts 118 are exposed through a front opening 121B defined by plug shell connector 121. In accordance with an aspect of the present embodiment illustrated in FIG. 2(b), side edges 111C of PCB 111 extend from side walls of plug shell connector 121 adjacent to front (plug portion) end 111B; as described below these side edge portions are utilized to secure PCBA 110 inside plastic frame 130.

Referring briefly to FIG. 1(A), plastic frame 130 includes frame body 140 and collar 150, both being formed from a rigid plastic material.

Figure 3A:
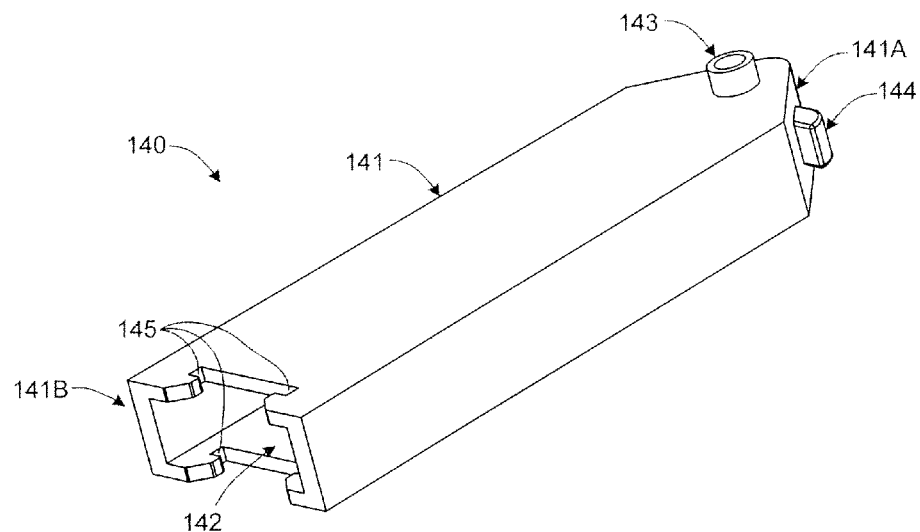
FIGS. 3(A) and 3(B) are perspective and end (elevation) views showing a plastic frame body of the USB device of FIG. 1(A)
Figure 3B:
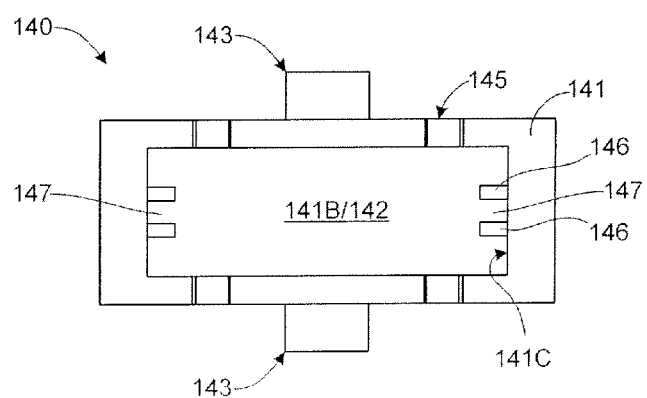

Referring to FIG. 3(A), frame body 140 includes an elongated wall 141 having an enclosed first rear portion 141A and surrounds a cut-out (hollow) central cavity 142. Wall 141 defines a front end opening 141B that communicates with central cavity 142. Locking protrusions in the form of key hole protrusions 143 and ear tabs 144 are integrally molded onto and extend from frame body 140 adjacent to enclosed rear portion 141A. As described below, these locking protrusions are utilized to secure rubber case body 170 onto plastic frame 130. In addition, locking grooves 145 are defined in frame body 140 adjacent to front end opening 141B. As described below, locking grooves 145 are utilized to secure collar 150 onto plastic frame body 140. As indicated in FIG. 3(B), which is a view through front end opening 141B into central cavity 142, an inside surface 141C of frame body 140 includes side rails 146 that define a central slot 147 for engaging side edges 111C of PCB 111 (see FIG. 2).

Figure 4:
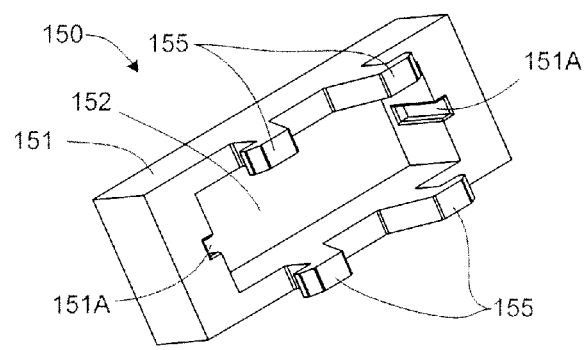
FIG. 4 is a perspective view showing a plastic frame collar of the USB device of FIG. 1(A)

FIG. 4 is a perspective view showing molded plastic collar 150 in additional detail. Collar 150 includes a rectangular base 151 defining a central opening therethrough and slots 151A that are disposed on inside surfaces of base 151 to receive side edges 111C of PCB 111 in the manner described below. In addition, collar 150 includes several locking fingers 155 that extend from base 151 and are shaped to engage corresponding locking grooves 145 defined in frame body 140.

Figure 5A:
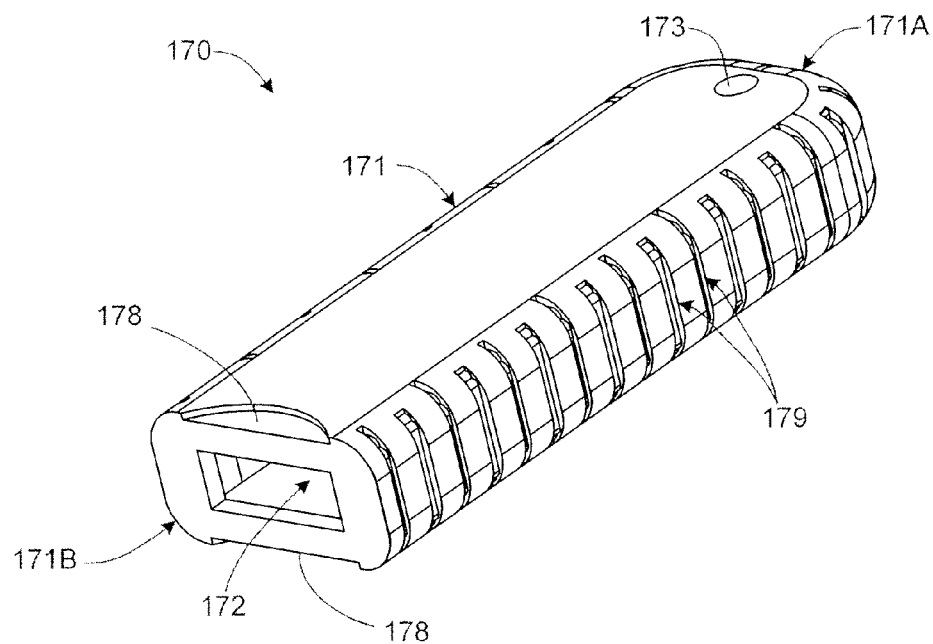
FIGS. 5(A) and 5(B) are perspective and end (elevation) views showing a rubber case body of the USB device of FIG. 1(A)
Figure 5B:
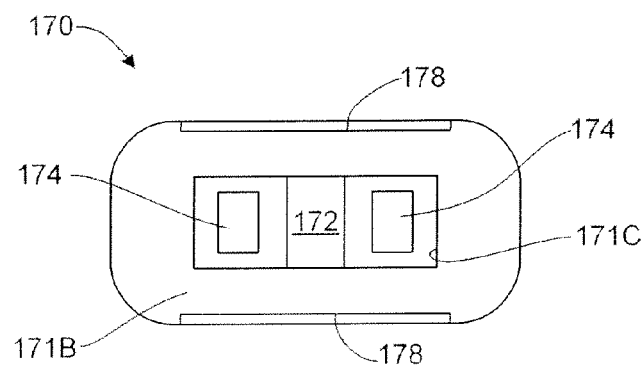

FIGS. 5(A) and 5(B) show molded rubber case body 170 in perspective and end views, respectively. Referring to FIG. 5(A), case body 170 includes an elongated wall 171 having a substantially closed rear portion 171A and defines a central cavity 172 and a front end opening 171B that communicates with central cavity 172. Case body 170 includes two key holes (engagement openings) 173 defined through wall 171 adjacent to closed end 171A and positioned to receive key hole protrusions 143 disposed on plastic frame body 140 (see FIG. 3(B)). In addition, as shown in FIG. 5(B), a pair of ear tab slots (engagement openings) 174 are defined on an inside surface of case body 170 adjacent to rear portion 171A and positioned to receive ear tabs 144 therein. As indicated in both FIGS. 5(A) and 5(B), case body 170 further includes curved recesses 178 disposed on opposite sides of wall 171 adjacent to the second front opening 171B. The purpose of curved recesses 178 is described below. Finally, as shown in FIG. 5(A), slip-resistant texturing patterns 179 are formed (i.e., molded into) along a side edge of wall 171 to enhance handling of the fully assembled USB flash device.

Figure 6A:
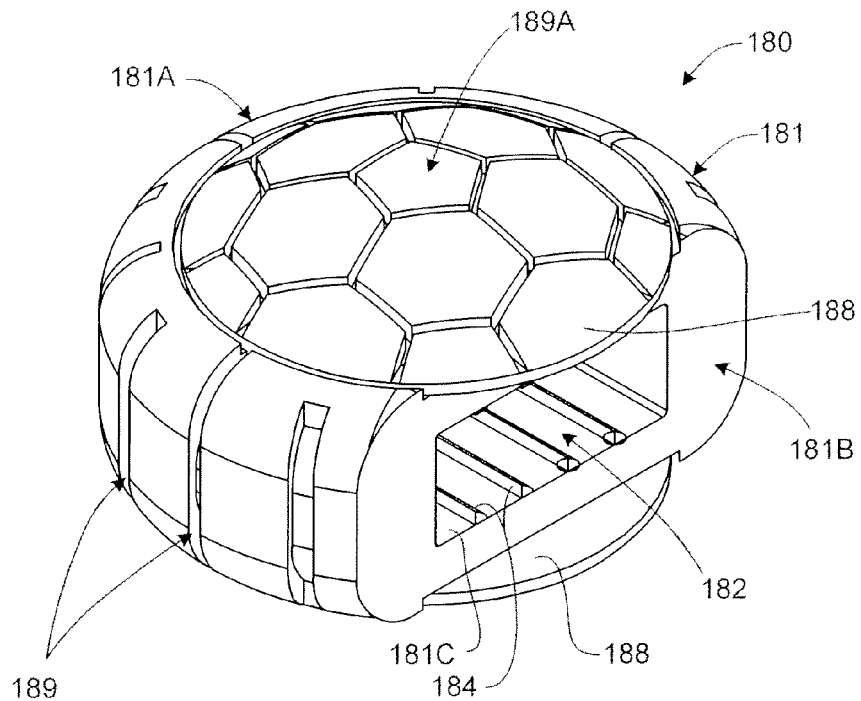
FIGS. 6(A) and 6(B) are perspective and end (elevation) views showing a rubber cap of the USB device of FIG. 1(A)
Figure 6B:
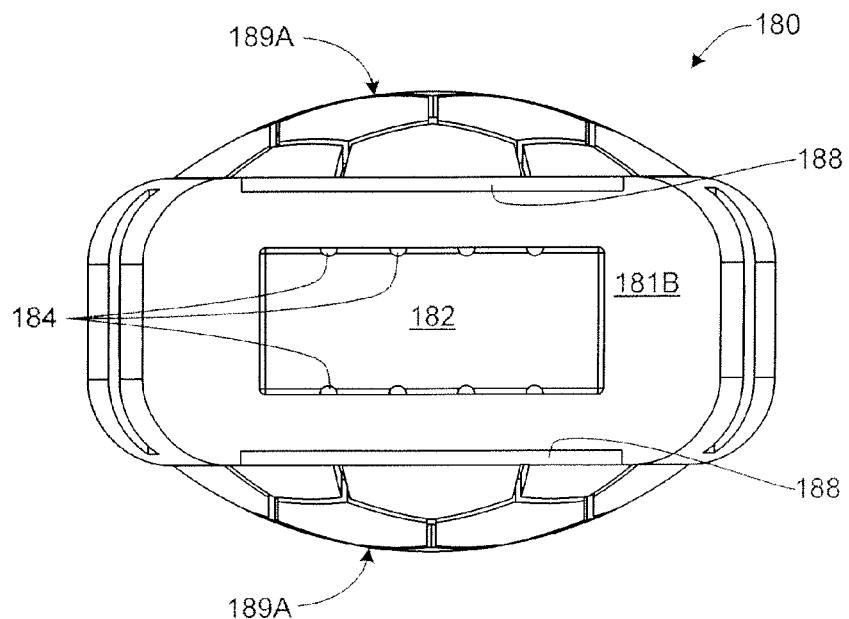

FIGS. 6(A) and 6(B) show molded rubber cap 180 in perspective and end views, respectively. Referring to FIG. 6(A), rubber cap 180 includes a somewhat spherical wall 181 having a closed rear portion 181A and defines a central cavity 182 and a front end opening 181B that communicates with central cavity 182. An inside surface 181C of wall 181 includes a plurality of rails 184 for facilitating sliding entry of plug connector 121 (see FIG. 2) when rubber cap 180 is mounted thereon. Rubber cap 180 includes curved protrusions 188 disposed on opposite sides of wall 181 adjacent to the front opening 181B. As shown in FIG. 6(A), rubber cap 180 includes integrally molded slip-resistant texturing made up of side patterns 189 formed along a side edge of wall 181, and a cosmetic feature 189A formed in the likeness of a soccer ball on opposing end surfaces thereof such that a portion of soccer ball feature 189A extends onto protrusions 188.

FIGS. 7(A) to 7(D) illustrate a method for assembling USB flash memory device 100 according to a specific embodiment of the present invention.

Referring briefly to FIGS. 2(A) and 2(B), the process begins by securing metal shell 120 to PCBA 110 such that plug shell connector 121 is disposed around plug portion 111B of PCB 111 with metal contacts 118 exposed through front opening 121B.

Figure 7A:
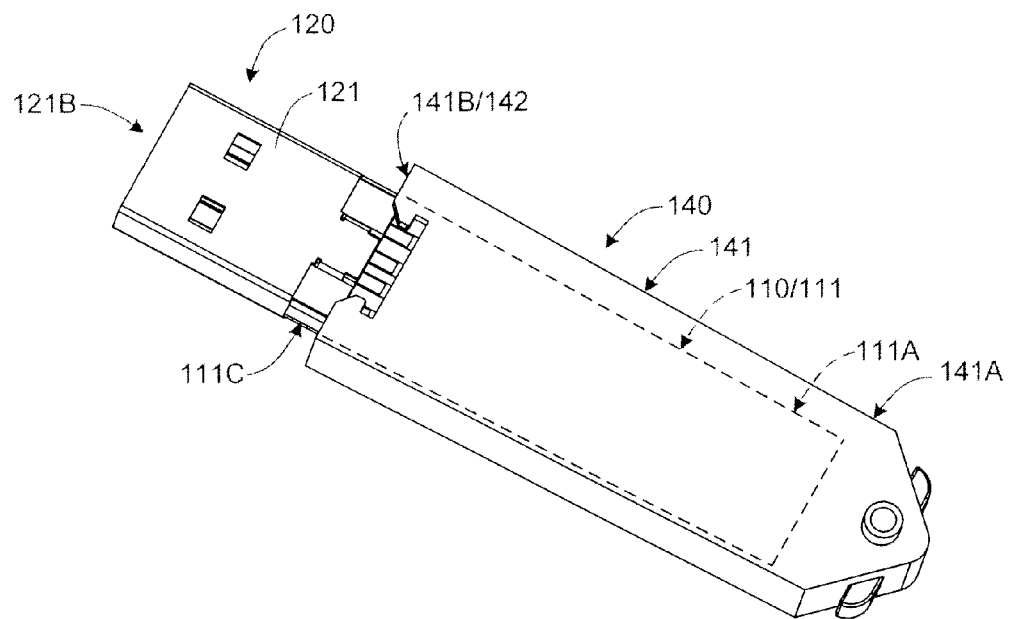
FIGS. 7(A), 7(B), 7(C) and 7(D) are perspective views showing a method for assembling the USB device of FIG. 1(A) according to another embodiment of the present invention.
Figure 7B:
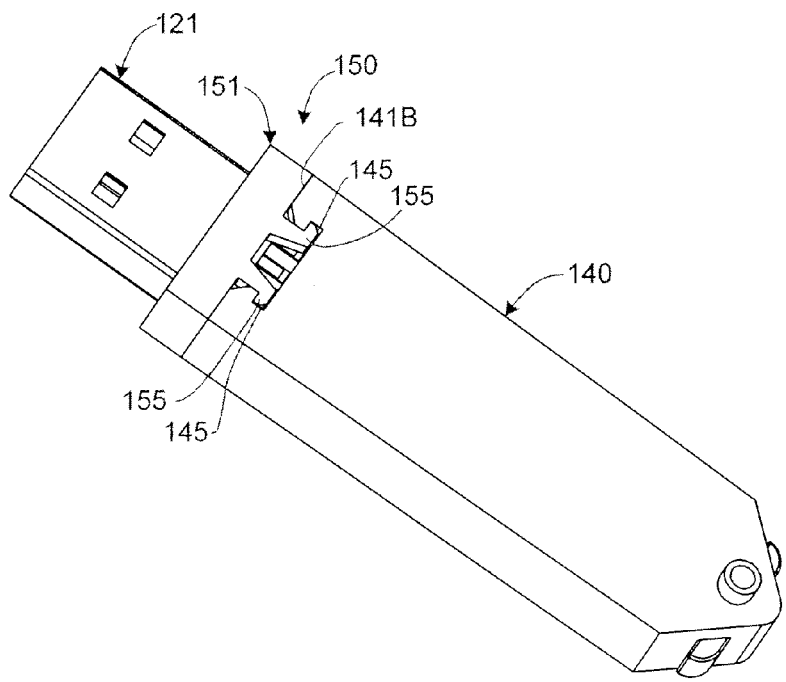

Next, plastic frame 130 (see FIG. 1) is secured onto metal shell 120 and PCBA 110. As shown in FIG. 7(A), this process begins by inserting PCB 111 through front opening 141B into central cavity 142 of frame body 140 until handle portion 111A of PCB 111 is disposed adjacent to enclosed rear portion 141A, and such that the plug shell connector 121 is exposed outside of the first front end opening 141B of frame body 140. Referring briefly to FIG. 3(B), in one embodiment this insertion process includes sliding side rails 111C (see FIG. 2) along central slots 147 formed inside frame body 140, thereby suspending PCBA 110 between the walls of frame body 140. Referring again to FIG. 7(A), note that portions of side rail 111C of PCB 111 disposed adjacent to plug shell connector 121 are exposed when PCBA 110 is fully inserted into frame body 140. Next, as shown in FIG. 7(B), collar 150 is mounted over and slid along plug shell connector 121, and secured onto open end 141B of frame body 140 such that locking fingers 155 are snap-coupled inside corresponding locking grooves 145. Note again that side edges 111C of PCB 111 become engaged in slots 151A during the mounting process, whereby collar 150 both supports the front end of PCBA 110 and prevents PCBA 110 from sliding out of the front of the completed USB flash device.

Figure 7C:
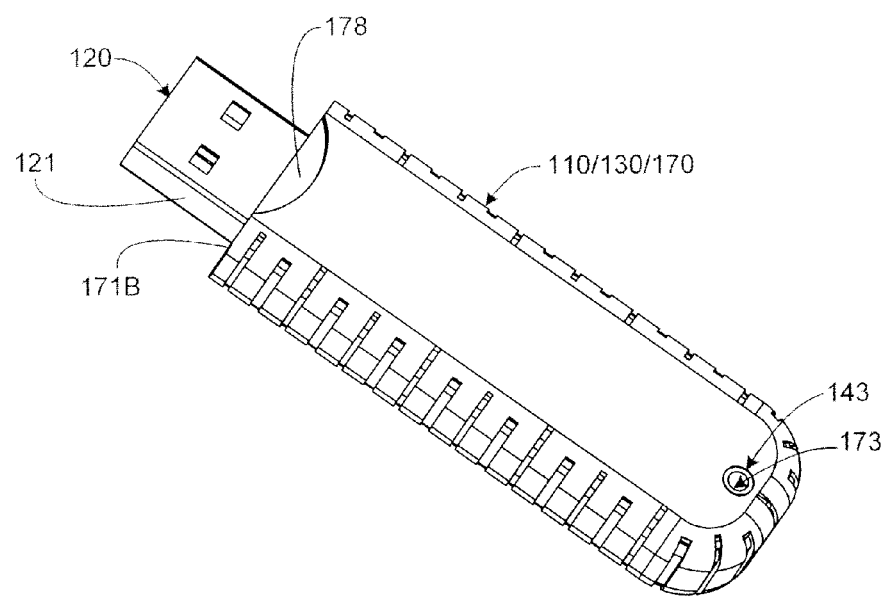
Figure 7D:
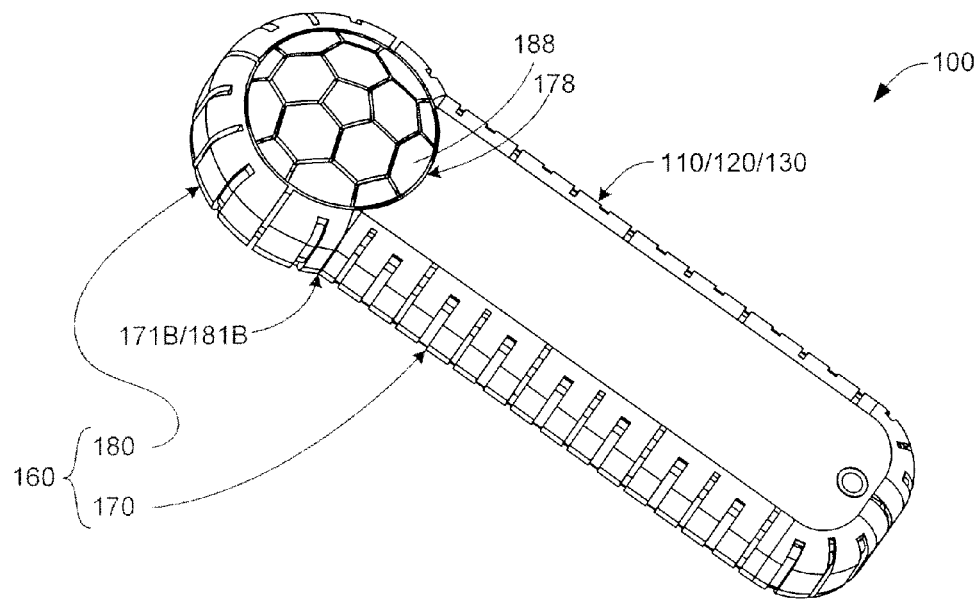

Next, as shown in FIGS. 7(C) and 7(D), rubber case is mounted on the assembly made up of PCBA 110, metal shell 120, and plastic frame 130. As indicated in FIG. 7(C) this process begins by inserting PCBA 110 and plastic frame 130 inside the central cavity of rubber case body 170 such that the entire handle portion of PCBA 110 is covered by case body 170, and such that plug shell connector 121 extends from the second front end opening 171B. During this mounting process key hole protrusion 143 of plastic frame body 140 becomes engaged in and partially extends through engagement hole 173, thereby securing case body 170 to plastic frame body 140. Similarly, although not shown, ear tabs 144 (see FIG. 3(A)) extending from frame body 140 becomes engaged into ear tab slots 174 (see FIG. 5(B)) defined inside case body 170 to further secure case body 170 to plastic frame body 140. Finally, as shown in FIG. 7(D), rubber cap 180 is mounted onto plug shell connector 121 (see FIG. 7(C)) such that front end opening 171B of case body 170 abuts the front end opening 181B of rubber cap 180, whereby the entirety of PCBA 110, metal frame 120, and plastic frame 130 is enclosed within rubber case 160. Note that protrusion 188 extending from cap 180 is received inside recess 178, thereby providing an appealing seamless appearance.

Figure 8A:
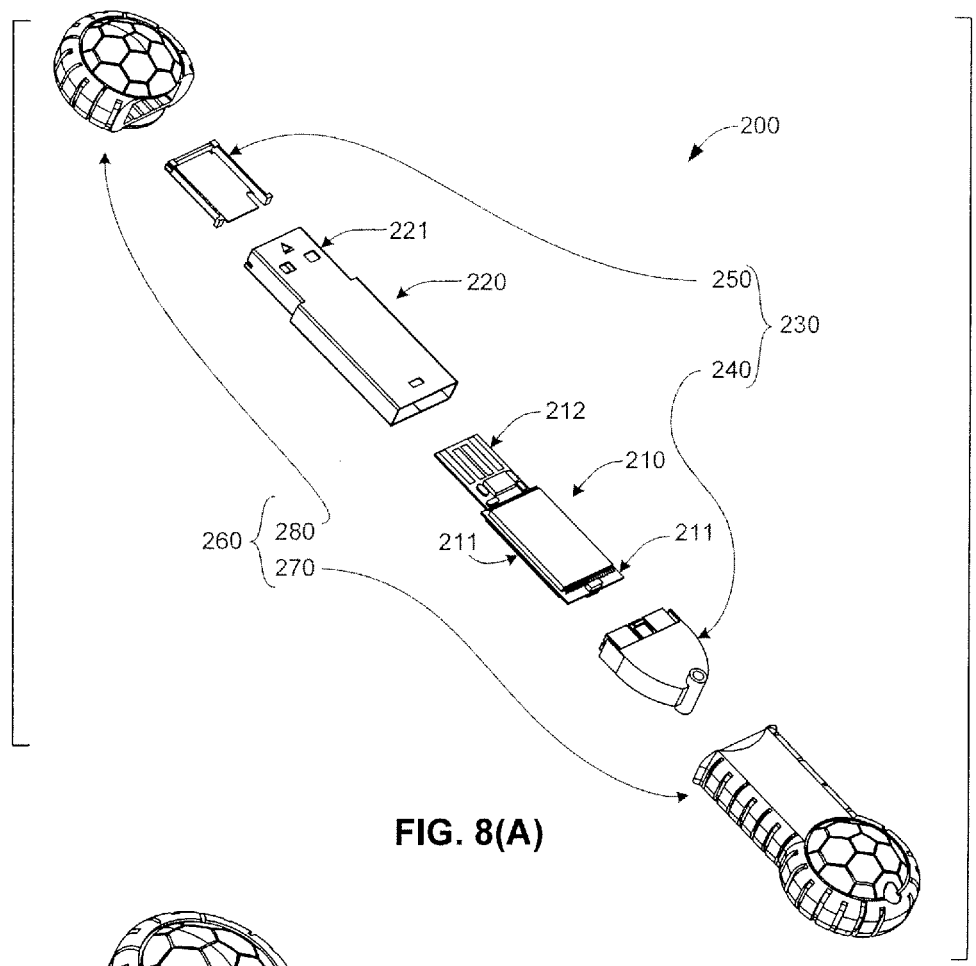
FIGS. 8(A) and 8(B) are exploded top side perspective and assembled top side perspective views showing a USB flash device according to another embodiment of the present invention.
Figure 8B:
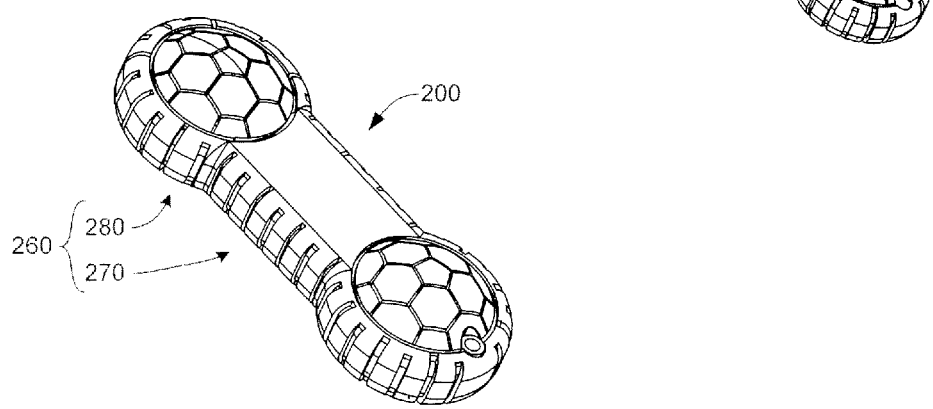

FIGS. 8(A) and 8(B) are exploded and assembled perspective views showing a USB device 200 according to a second embodiment of the present invention. USB device 200 generally includes a PCBA 210 including a PCB 211, a metal frame 220 attached to PCBA 210, a plastic frame 230 including a frame body 240 that supports a handle portion 211A of PCB 211 of PCBA 210 and a plastic tray 250 for supporting a plug portion 212 of PCBA 210, and a protective rubber case 260 including a case body 270 that is mounted over frame body 240, and a rubber cap 280 for covering a plug shell portion 221 of metal frame 220. As indicated in FIG. 8(B), when fully assembled with rubber cap 280 mounted over plug shell portion 221, USB device 200 is entirely encased by case body 270 and rubber cap 280 of rubber case 260.

Referring to FIG. 9, PBCA 210 includes PCB 211 having a rear (handle) portion 211A and a front (plug) portion 212, an upper surface 213 (facing downward in FIG. 9) and a lower surface 214. A flash memory device 215 and a memory control IC 216 and auxiliary ICs are mounted on lower surface 214. Formed on upper surface 213 of PCB 211 on plug portion 212 are metal contacts (not shown) that are arranged and formed as indicated above with reference to FIGS. 2(A) and 2(B). Front corners 211C are formed at the junction between handle portion 211A and plug portion 212.

Referring to FIGS. 10(A) and 10(B), metal shell 220 includes a plug shell connector 221 that is integrally connected at its rear end 221A to a handle portion 222, which is slightly wider than plug shell connector 221 and defines front corners 222B at a junction with plug shell connector 221. Plug shell connector 221 includes a front opening 221B that includes slots 225 used to connect plastic tray 250 in the manner described below. In addition, upper wall 223 (FIG. 10(A)) and lower wall 224 (FIG. 10(B)) include engagement openings 228 for engaging with frame body 240 in the manner described below. As indicated by seam 229 in FIG. 10(B), metal shell 220 is preferably formed from a single metal sheet that is folded using known techniques to produce the depicted shape.

Figure 11A:
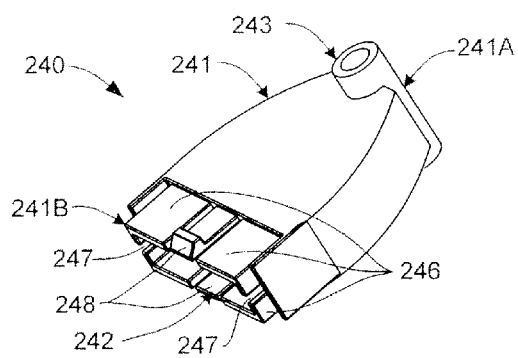
FIGS. 11(A) and 11(B) are perspective and end (elevation) views showing a plastic frame body of the USB device of FIG. 8(A)
Figure 11B:
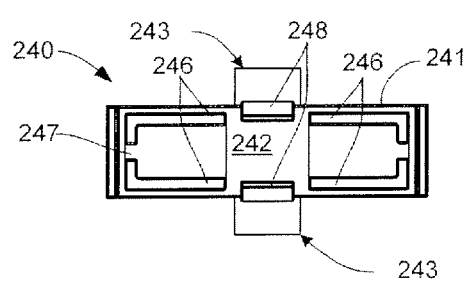

FIGS. 11(A) and 11(B) show frame body 240 of plastic frame 230 (see FIG. 8(A)). Frame body 240 includes a wall 241 having an enclosed first rear portion 241A and surrounds a cut-out (hollow) central cavity 242. Wall 241 defines a front end opening 241B that communicates with central cavity 242. Locking protrusions in the form of key hole protrusion 243 is integrally molded onto and extend from frame body 240 adjacent to enclosed rear portion 241A. Flat tabs 246 and locking fingers 248 and are integrally molded and extend from front end opening 241B, with flat tabs 246 defining a central slot 247 for engaging a rear end of PCB 211 (see FIG. 9).

Figure 12:
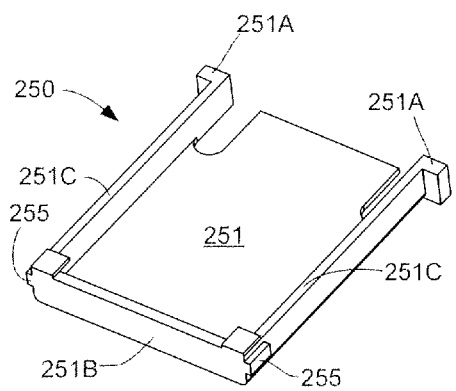
FIG. 12 is a perspective view showing a plastic tray of the USB device of FIG. 8(A)

FIG. 12 is a perspective view showing molded plastic tray 250 in additional detail. Tray 250 includes a rectangular base 251 including rear wall portions 251A, a front wall portion 251B, and side wall portions 251C. In addition, tray includes two tabs 255 that extend from side walls 251C adjacent to front wall 251B and are shaped to engage corresponding slots 225 defined in metal frame 220 (see FIG. 10(A)).

Figure 13:
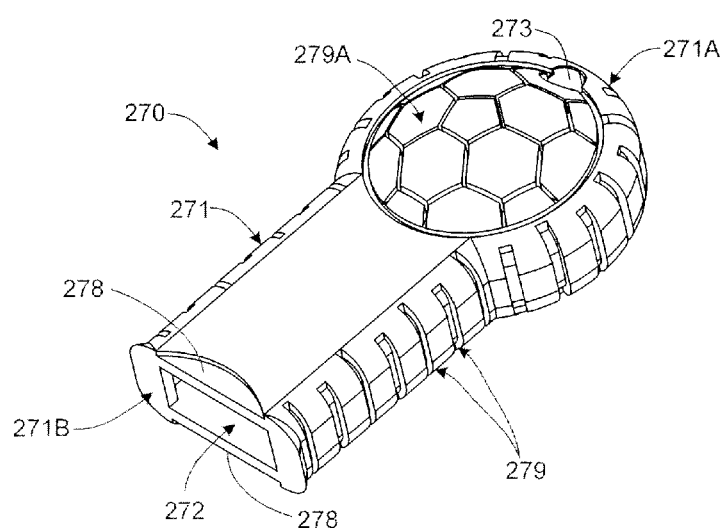
FIG. 13 is a perspective view showing a rubber case body of the USB device of FIG. 8(A)

Referring to FIG. 13, case body 270 includes an elongated wall 271 having a substantially closed rear portion 271A and defines a central cavity 272 and a front end opening 271B that communicates with central cavity 272. Case body 270 includes a key hole (engagement openings) 273 defined through wall 271 adjacent to closed end 271A and positioned to receive key hole protrusion 243 disposed on plastic frame body 240 (see FIG. 11(B)). Case body 270 further includes curved recesses 278 disposed on opposite sides of wall 271 adjacent to the front opening 271B, and slip-resistant texturing patterns 279 are formed along a side edge of wall 271. Finally, in accordance with the present embodiment, a first cosmetic feature 279A is formed in the likeness of a soccer ball adjacent to closed rear end 271A.

Figure 14A:
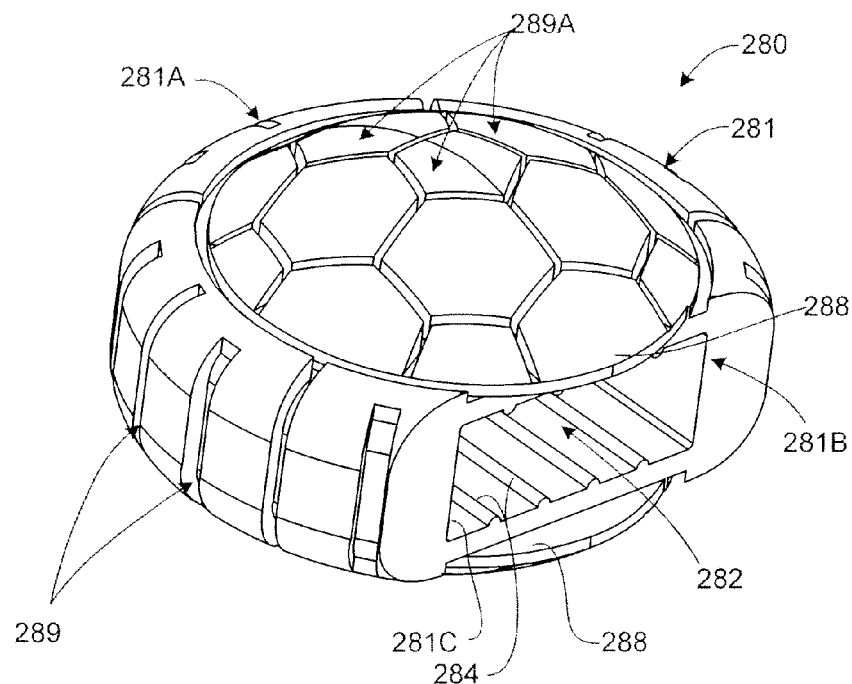
FIGS. 14(A) and 14(B) are perspective and end (elevation) views showing a rubber cap of the USB device of FIG. 8(A)
Figure 14B:
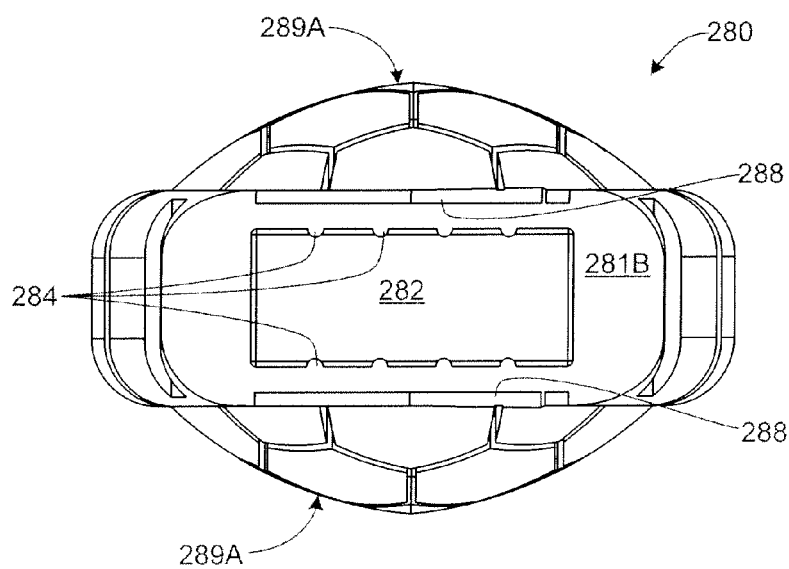

FIGS. 14(A) and 14(B) show molded rubber cap 280 in perspective and end views, respectively. Similar to cap 180 (described above), rubber cap 280 includes a somewhat spherical wall 281 having a closed rear portion 281A and defines a central cavity 282 and a front end opening 281B that communicates with central cavity 282. An inside surface 281C of wall 281 includes a plurality of rails 284 for facilitating sliding entry of plug connector 221 (see FIG. 10) when rubber cap 280 is mounted thereon. Rubber cap 280 includes curved protrusions 288 disposed on opposite sides of wall 281 adjacent to the front opening 281B. Rubber cap 280 includes slip-resistant texturing 289 and a second cosmetic feature 289A formed in the likeness of a soccer ball.

FIGS. 15(A) to 17(B) illustrate a method for assembling USB flash memory device 200 according to another embodiment of the present invention.

Figure 15A:
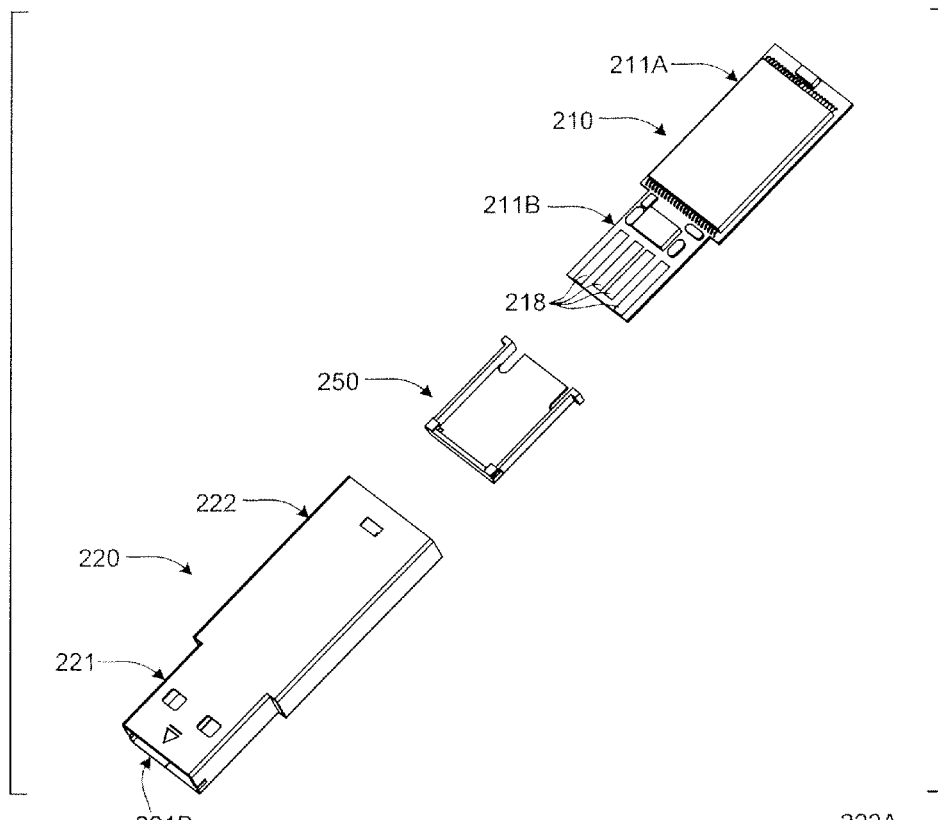
FIGS. 15(A) and 15(B) are perspective views showing a method for assembling the metal shell and PCBA of the USB device of FIG. 8(A) according to another embodiment of the present invention.
Figure 15B:
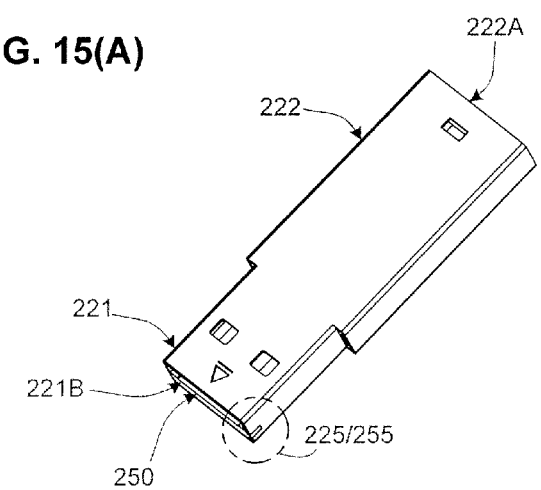

Referring briefly to FIGS. 15(A) and 15(B), the process begins by securing metal shell 220 to PCBA 210 such that plug shell connector 221 is disposed around plug portion 211B of PCB 211 with metal contacts 218 exposed through front opening 221B. Plastic tray 250 is inserted into plug shell connector 221 prior to inserting PCBA 210 to support plug portion 211B of PCB 211. As indicated in FIG. 15(B), this process involved inserting tray 250 such that tabs 255 are snapped or otherwise engaged in slots 225. PCBA is then inserted into rear opening 222A of metal frame 220 such that plug portion 211B enters plug shell connector 221, and handle portion 211A is disposed in handle portion 222.

Figure 16A:
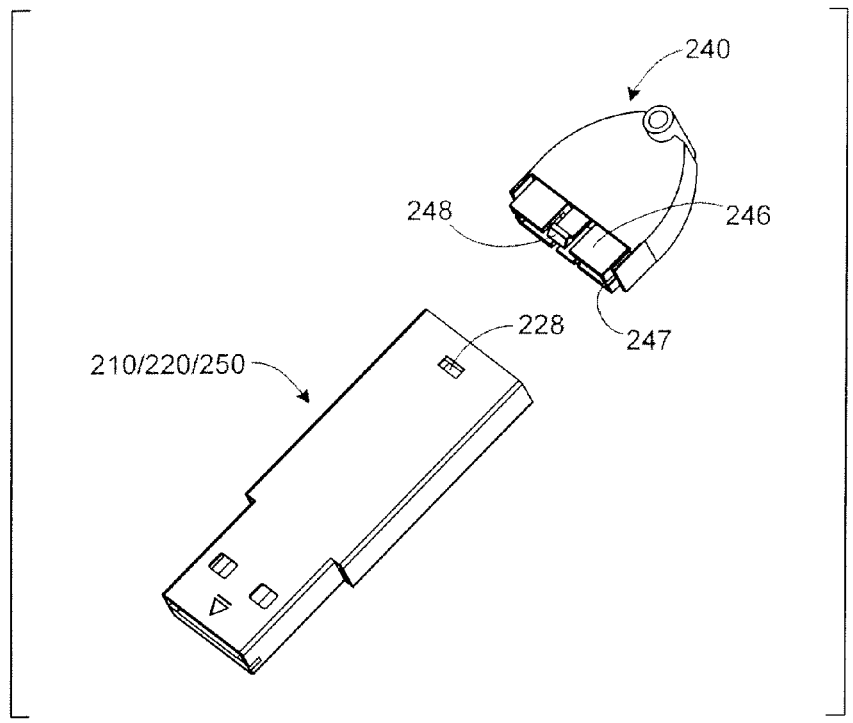
FIGS. 16(A) and 16(B) are perspective views showing a method for assembling the plastic frame body onto the metal shell and PCBA of the USB device of FIG. 8(A) according to another embodiment of the present invention.
Figure 16B:
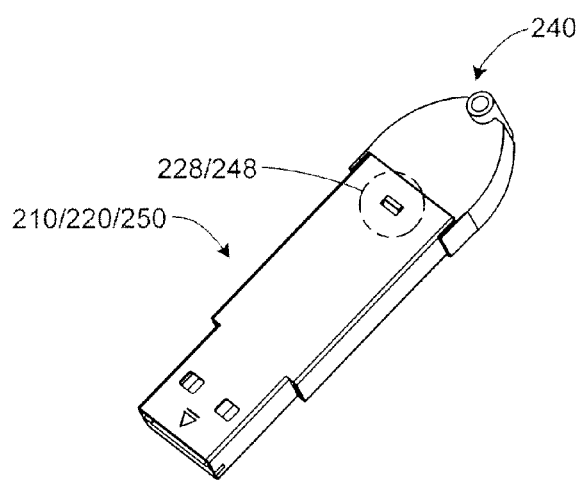

Next, as indicated in FIGS. 16(A) and 16(B), plastic frame body 240 is secured onto metal shell 220 and PCBA 210. As indicated in FIG. 16(B), this process involves snap coupling locking fingers 248 into engagement openings 228 formed in metal shell 220. In addition, this process involves aligning slots 247 defined by tabs 246 with a rear edge (not shown) of PCB 210 such that PCB 210 is supported by frame body 240 when the snap-coupling process is completed as shown in FIG. 16(B).

Figure 17A:
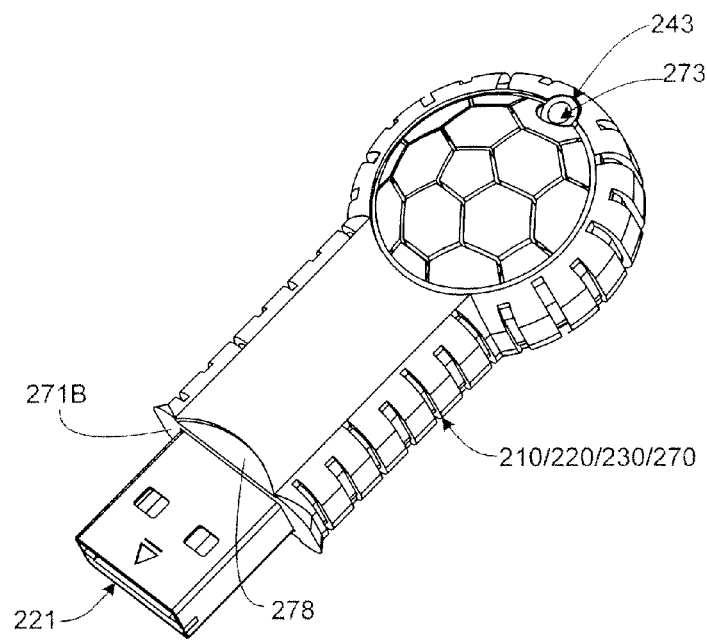
FIGS. 17(A) and 17(B) are perspective views showing a method for mounting the rubber case onto the metal shell and plastic frame of the USB device of FIG. 8(A) according to another embodiment of the present invention.
Figure 17B:
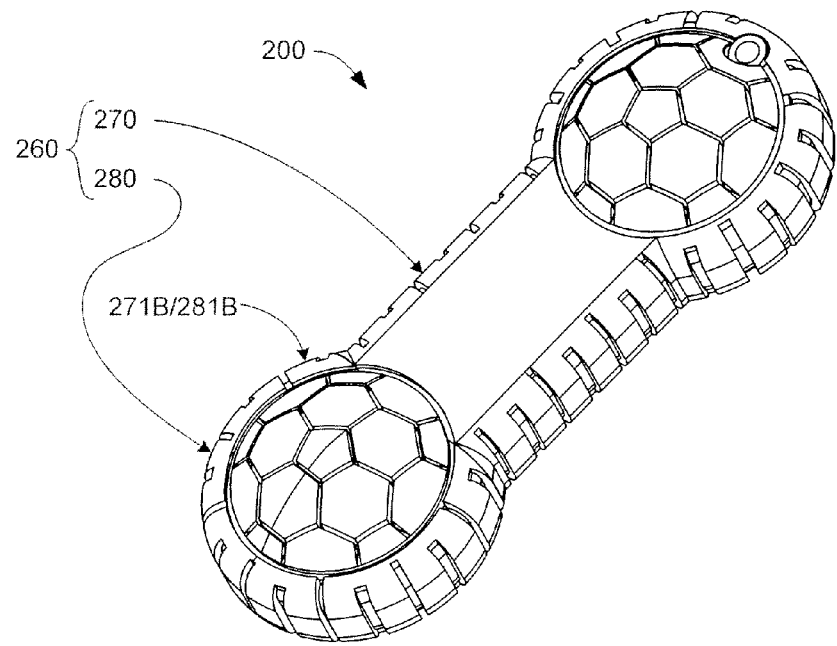

Next, as shown in FIGS. 17(A) and 17(B), rubber case 260 is mounted on the assembly made up of PCBA 210, metal shell 220, and plastic frame 230. As indicated in FIG. 17(A) this process begins by inserting PCBA 210, metal shell 220 and plastic frame 230 inside the central cavity of rubber case body 270 such that the entire handle portion of PCBA 210 is covered by case body 270, and such that plug shell connector 221 extends from the second front end opening 271B. During this mounting process key hole protrusion 243 of plastic frame body 240 becomes engaged in and partially extends through engagement hole 273, thereby securing case body 270 to plastic frame body 240. Finally, as shown in FIG. 17(B), rubber cap 280 is mounted onto plug shell connector 221 (see FIG. 10(A)) such that front end opening 271B of case body 270 abuts the front end opening 281B of rubber cap 280, whereby the entirety of PCBA 210, metal frame 220, and plastic frame 230 is enclosed within rubber case 260.

Although the present invention has been described with respect to certain specific embodiments, it will be clear to those skilled in the art that the inventive features of the present invention are applicable to other embodiments as well, all of which are intended to fall within the scope of the present invention. For example, although the specific embodiments include soccer ball features, other cosmetic features may be provided, such as another sports ball (e.g., basketball, baseball, football, or golf ball), a sports team logo, or a company logo.

The invention claimed is:

1. A USB device comprising:
   a printed circuit board assembly (PCBA) including a printed circuit board (PCB) having a handle portion and a plug portion, at least one integrated circuit mounted on the handle portion of the PCB, wherein the plug portion includes one or more metal contacts that are electrically connected to the integrated circuit;
   a metal shell secured to the PCBA and including a plug shell connector disposed around the plug portion of the PCB such that the metal contacts are exposed through a front opening defined by the plug shell connector;
   a plastic frame including a frame body having an enclosed first rear portion and defining a first central cavity and a first front end opening, wherein the PCBA is secured to the plastic frame such that the handle portion of the PCB is at least partially received inside the first central cavity adjacent to the closed second rear portion, and such that the plug shell connector is exposed outside of the first front end opening, the frame body including one or more locking protrusions disposed adjacent to the first rear end; and
   a rubber case including a case body having a substantially closed second rear portion and defining a second central cavity and a second front end opening, wherein the plastic frame is received inside the second central cavity such that the entire handle portion of the PCB is covered by the case body, and such that the plug shell connector extends from the second front end opening, wherein the case body includes at least one engagement opening, and wherein the one or more locking protrusions are received inside said at least one engagement opening such that the case body is secured to the plastic frame.

2. The USB device of claim 1, wherein said integrated circuit comprises a flash memory device.

3. The USB device of claim 1,
   wherein said locking protrusions comprise at least one of a key hole protrusion and an ear tab extending from the frame body adjacent to the enclosed first rear portion, and
   wherein said at least one engagement opening comprises at least one of a key hole defined through a wall of said case body with said key hole protrusion disposed therein, and an ear tab slot defined on an inside surface of said case body adjacent to said second rear portion with said ear tab disposed therein.

4. The USB device of claim 1, wherein the rubber case further comprising a rubber cap having a closed third rear portion and defining a second central cavity and a third front end opening, wherein the plug shell connector of the metal shell is received inside the third central cavity such that the second front end opening abuts the third front end opening, whereby the entirety of said PCBA is enclosed within said rubber case.

5. The USB device of claim 4,
   wherein the rubber cap includes a protrusion disposed adjacent to the third front end opening,
   wherein the case body defines a recess disposed adjacent to the second front opening, and
   wherein the protrusion extends into the recess.

6. The USB device of claim 5, wherein the rubber cap comprises a soccer ball pattern disposed such that a portion of the soccer ball pattern forms said protrusion.

7. The USB device of claim 5, wherein at least one of the rubber cap and the case body comprises slip-resistant texturing.

8. The USB device of claim 5, wherein at least one of the rubber cap and the case body comprises a cosmetic feature including at least one of a ball, a sports team logo, and a company logo.

9. The USB device of claim 1, wherein the plastic frame further comprises a collar disposed over the plug shell connector and attached to the frame body adjacent to the first front end opening.

10. The USB device of claim 9, wherein the collar comprises a base defining a central opening through which said plug shell connector extends, the base also defining at least one slot disposed to receive a side edge of the PCB, and at least one locking finger engaged in a corresponding locking groove defined in said frame body.

11. The USB device of claim 1,
    wherein the metal shell further comprises a handle shell portion integrally connected to the plug shell connector and disposed over the handle portion of said PCB, and
    wherein the frame body is snap-coupled to a rear end of the handle shell portion.

12. The USB device of claim 11, wherein the plastic frame further comprises a plastic tray disposed between a portion of the plug shell connector and the plug portion of the PCB.

13. A method for assembling a USB device comprising:
    securing a metal shell onto a printed circuit board assembly (PCBA), the PCBA including a printed circuit board (PCB) having a handle portion and a plug portion, wherein the plug portion includes one or more metal contacts that are electrically connected to the integrated circuit, and wherein securing the metal shell includes disposing a plug shell connector around the plug portion of the PCB such that the metal contacts are exposed through a front opening defined by the plug shell connector;
    securing a plastic frame onto the metal shell and the PCBA, the plastic frame including a frame body having an enclosed first rear portion and defining a first central cavity and a first front end opening, wherein securing the plastic frame includes disposing at least a portion of the handle portion of the PCB inside the first central cavity such that the plug shell connector is exposed outside of the first front end opening; and mounting a rubber case onto the metal shell, PCBA and plastic frame, the rubber case including a case body having a substantially closed second rear portion and defining a second central cavity and a second front end opening, wherein mounting the rubber case includes inserting the frame body inside the second central cavity such that the entire handle portion of the PCB is covered by the case body, and such that the plug shell connector extends from the second front end opening.

14. The method of claim 13, wherein mounting the rubber case comprises engaging one of a key hole protrusion and an ear tab extending from the frame body adjacent to the enclosed first rear portion into at least one of a key hole defined through a wall of said case body and an ear tab slot defined on an inside surface of said case body adjacent to said second rear portion.

15. The method of claim 13,
wherein securing the metal shell further comprises mounting a handle shell portion of said metal shell over the handle portion of said PCB, and
wherein securing the plastic frame comprises snap-coupling the frame body to a rear end of the handle shell portion.

16. The method of claim 13, wherein securing the plastic frame further comprises pressing a plastic tray into the plug shell connector until tabs provided on the plastic tray are snapped into slots defined in the plug shell connector.

17. The method of claim 13, further comprising mounting a rubber cap of said rubber case onto the plug shell connector of the metal shell such that the second front end opening of the case body abuts the a third front end opening of the rubber cap, whereby the entirety of said PCBA is enclosed within said rubber case.

18. The method of claim 17,
wherein the rubber cap includes a protrusion disposed adjacent to the third front end opening,
wherein the case body defines a recess disposed adjacent to the second front opening, and
wherein mounting the rubber cap further comprises causing the protrusion to extend into the recess.

19. The method of claim 13, wherein securing the plastic frame comprises mounting a collar over the plug shell connector and attaching the collar over the first front end opening of the frame body.

20. The method of claim 19, wherein mounting the collar comprises inserting said plug shell connector through a central opening defined by the collar, and sliding a side edge of the PCB into a slot disposed on an inside surface of the collar.

\* \* \* \* \*